(12) United States Patent
Melville et al.

(10) Patent No.: US 8,957,484 B2
(45) Date of Patent: Feb. 17, 2015

(54) PIEZOELECTRIC SUBSTRATE, FABRICATION AND RELATED METHODS

(75) Inventors: Charles D. Melville, Issaquah, WA (US); Richard S. Johnston, Sammamish, WA (US)

(73) Assignee: University of Washington, Seattle, WA (US)

( * ) Notice: Subject to any disclaimer, the term of this patent is extended or adjusted under 35 U.S.C. 154(b) by 833 days.

(21) Appl. No.: 12/040,249

(22) Filed: Feb. 29, 2008

(65) Prior Publication Data

US 2009/0218641 A1    Sep. 3, 2009

(51) Int. Cl.
| | |
|---|---|
| *H01L 41/08* | (2006.01) |
| *H01L 41/29* | (2013.01) |
| *H01L 41/09* | (2006.01) |
| *G02B 6/35* | (2006.01) |
| *G02B 26/10* | (2006.01) |

(52) U.S. Cl.
CPC .............. *H01L 41/29* (2013.01); *H01L 41/092* (2013.01); *G02B 6/3504* (2013.01); *G02B 6/3578* (2013.01); *G02B 26/103* (2013.01)
USPC ...................................................... 257/415

(58) Field of Classification Search
CPC .................................................. H01L 27/1288
USPC ................................................ 438/670, 951
See application file for complete search history.

(56) References Cited

U.S. PATENT DOCUMENTS

| | | | |
|---|---|---|---|
| 6,077,560 A * | 6/2000 | Moshrefzadeh et al. ..... 427/108 |
| 6,294,775 B1 | 9/2001 | Seibel et al. |
| 6,563,105 B2 | 5/2003 | Seibel et al. |
| 6,845,190 B1 | 1/2005 | Smithwick et al. |
| 6,856,712 B2 | 2/2005 | Fauver et al. |
| 6,975,898 B2 | 12/2005 | Seibel |
| 7,159,782 B2 | 1/2007 | Johnston et al. |
| 7,189,961 B2 | 3/2007 | Johnston et al. |
| 7,298,938 B2 | 11/2007 | Johnston |
| 8,109,612 B2 | 2/2012 | Kojima et al. |
| 2001/0055462 A1 | 12/2001 | Seibel |
| 2002/0064341 A1 | 5/2002 | Fauver et al. |
| 2002/0158525 A1 | 10/2002 | Kim et al. |

(Continued)

FOREIGN PATENT DOCUMENTS

| | | |
|---|---|---|
| EP | 1427031 A2 | 6/2004 |
| JP | 07249392 A | 9/1995 |

(Continued)

OTHER PUBLICATIONS

U.S. Appl. No. 10/956,241, entitled,"Remapping Methods to Reduce Distortions in Images," filed Oct. 1, 2004 (First Inventor: R. Johnston).

(Continued)

*Primary Examiner* — Fernando L Toledo
*Assistant Examiner* — Valerie N Newton
(74) *Attorney, Agent, or Firm* — Wilson Sonsini Goodrich & Rosati

(57) ABSTRACT

Improved methods, and related systems and devices, for fabricating selectively patterned piezoelectric substrates suitable for use in a wide variety of systems and devices. A method can include providing a piezoelectric substrate having a protrusion of substrate material, depositing an electrically conductive coating so as to cover a portion of a side of the substrate and protrusion, and removing a portion of the coated protrusion.

21 Claims, 7 Drawing Sheets

(56) References Cited

U.S. PATENT DOCUMENTS

| | | | |
|---|---|---|---|
| 2002/0175419 A1* | 11/2002 | Wang et al. | 257/774 |
| 2006/0105492 A1* | 5/2006 | Veres et al. | 438/99 |
| 2008/0131048 A1* | 6/2008 | Yoo et al. | 385/6 |

FOREIGN PATENT DOCUMENTS

| | | |
|---|---|---|
| JP | H 0983030 A | 3/1997 |
| JP | 2002125383 A | 4/2002 |
| JP | 2006022557 A | 1/2006 |
| JP | 2006096155 A | 4/2006 |
| JP | 2007080734 A | 3/2007 |
| JP | 2007096283 A | 4/2007 |
| JP | 2007329460 A | 12/2007 |

OTHER PUBLICATIONS

European search report and opinion dated Dec. 10, 2012 for EP Application No. 09152443.9.

* cited by examiner

PIEZOELECTRIC SUBSTRATE, FABRICATION AND RELATED METHODS

BACKGROUND OF THE INVENTION

The present invention relates generally to piezoelectric based assemblies and devices. More particularly, the present invention provides improved methods, and related systems and devices, for fabricating selectively patterned piezoelectric substrates suitable for use in a wide variety of systems and devices.

Piezoelectric substrates produce a displacement with a force capability when voltage is applied. Many applications exist where a piezoelectric substrates may be used, including precision positioning, generation of forces or pressures in static or dynamic situations, voltage/power generation, and numerous sensors, actuators, and the like. One important application of piezoelectric substrates includes use in piezoelectric based actuators. As applied voltages correspond to precise changes in the width/shape of the substrate, width can be changed with very high precision, making piezo substrates an important tool for positioning objects with extreme accuracy—thus their use in actuators.

Actuator configuration and design can vary greatly depending on application. Piezoelectric stack actuators, for example, are produced by stacking up piezoelectric substrate disks or plates, with the axis of the stack being the asis of linear motion when a voltage is applied. Actuators can further include tube-shaped actuators, which commonly include a monolithic substrate that contracts (e.g., laterally, longitudinally) when voltage is applied between inner and outer electrodes. Other exemplary configurations include disk and ring shaped actuators, as well as block, bender, and bimorph styles.

Piezoelectric based actuators have found use in numerous systems, including various optical image acquisition systems. One example of such systems making use of piezo actuator assemblies includes certain recently developed improved scanning beam systems. These improved scanning beam systems are typically much smaller than conventional devices, and make use of a cantilevered optical fiber that can be scanned in one or more dimensions. Light is projected out of the end of the optical fiber, through a optical/lens system, and onto a target area of a surface. To acquire an image, a time series of backscattered reflected light is captured with one or more light detector(s) of the system. More specifically, signals from one or more photodetector(s) correspond to the brightness of the small portion of the image illuminated by the fiber at that point in time. As the motion of the optical fiber is predictable and repeatable, the reflected backscattered light intensity measured at the detector(s) can be sequentially correlated with known positions of the optical fiber. This allows a two-dimensional image to be generated one pixel at a time. Some exemplary scanning fiber devices are described in U.S. Pat. No. 6,294,775B1 (Seibel) and U.S. Pat. No. 6,563,105B2 (Seibel), and in U.S. Patent Application Publication Nos. 2001/0055462A1 (Seibel) and 2002/0064341A1 (Seibel), the complete disclosures of which are incorporated herein by reference.

While piezo actuator configuration and design can vary greatly depending on application, devices typically includes a substrate including a piezoelectric material, where the substrate is coupled with electrodes that are often patterned on one or more substrate surfaces. Although various configurations and designs of patterned piezoelectric substrates are known, substrate patterning and fabrication is typically tedious and often inefficient. Commonly used methods often involve complex masking and/or patterning techniques including numerous steps and processes, that can be time consuming, costly, and/or inaccurate. Therefore, what is needed are fabrication techniques and resulting devices, that are more easily and effectively performed for production of precision patterned piezo substrates for use in a variety of applications.

BRIEF SUMMARY OF THE INVENTION

The present invention provides patterned piezoelectric substrates, aspects of which are disclosed herein, as well as techniques and methods for fabricating patterned piezoelectric substrates. The currently described techniques include first providing an unpatterned piezoelectric substrate material with certain physical features that aid in the formation of patterned electrodes. Physical features can include certain protrusions or raised areas on an outer surface of the substrate, such as a sort of raised "rib" on an outer surface of a substrate (e.g., piezoelectric tube). The protrusions are used to produce a non-conducting or insulating regions between patterned electrically conductive regions. Electrically conductive material is coated on a surface of the substrate including the protrusions or ribs, then a portion or the entire protrusion is removed.

In one embodiment, the present invention includes methods of producing patterned piezoelectric substrates, such as a patterned actuator tube. Such a method can include providing a piezoelectric substrate having a first side and a second side, the first side having a protrusion of substrate material. The method further includes depositing an electrically conductive coating so as to cover a portion of the first side and protrusion, and removing a portion of the coated protrusion. Removal can expose substrate material at the removal site while leaving deposited coating adjacent to the removal site substantially intact. In embodiments including producing a patterned piezoelectric tube (actuator tube), methods include providing a tube having a piezoelectric material, an interior lumen, and an outer surface having one or more protrusions. Methods further include depositing a coating on the outer surface of the tube and protrusion, and removing at least a portion of the coated protrusions for selective patterning on the outer surface of the tube.

In another embodiment patterned piezoelectric tube. Such a tube can include an interior lumen having a surface coated with an electrically conductive material and an outer surface. The outer surface can include a plurality of regions having an electrically conductive material and a plurality of protrusions. The protrusions can be disposed on the outer surface so as to be received by grooves of a mated part for coupling of the tube and the mated part.

For a fuller understanding of the nature and advantages of the present invention, reference should be made to the ensuing detailed description taken in conjunction with the accompanying drawings. The drawings represent embodiments of the present invention by way of illustration. The invention is capable of modification in various respects without departing from the invention. Accordingly, the drawings/figures and descriptions of these embodiments are illustrative in nature and not restrictive.

DETAILED DESCRIPTION OF THE INVENTION

The present invention provides patterned piezoelectric substrates, aspects of which are disclosed herein, as well as techniques and methods for fabricating patterned piezoelectric substrates. Producing electrodes or conducting material deposited in specific patterns on a piezoelectric substrate, such as a plate, tube, etc., according to previously known techniques typically required many complicated steps. Existing processes often require use of masking and photoresist and exposing deposited surfaces to produce the desired electrode pattern. Existing processes typically require many steps, specialized equipment, and long process times. In contrast, the present invention provides fabrication techniques for producing a substrate having the desired electrode pattern in a way that is easily manufactured and can be designed suitable for a variety of applications. The currently described techniques include producing an unpatterned piezoelectric substrate material with certain physical features that aid in the formation of patterned electrodes. Physical features can include certain protrusions or raised areas on an outer surface of the substrate. In one embodiment, protrusions can be in the form of sort of raised "ribs" on an outer surface of a substrate tube, with the ribs running parallel to the axis of the tube and along a tube length. The protrusions are used to produce non-conducting or insulating regions between patterned electrodes. Electrically conductive material is coated on a surface of the substrate including the protrusions or ribs, then a portion or the entire protrusion is removed. Removal can be accomplished by a variety of approaches, such as cutting, abrasion, and the like.

Fabrication techniques including patterning and removal of material as described provides numerous advantages. For example, the methods of the current invention allow fabrication and patterning while maintaining the structural strength and integrity of the substrate, compared to methods including coating deposition and removal in the absence of protrusions where removal of coating material cuts into the thickness of the substrate itself. Such a weakening of the substrate due to a decreased thickness at the removal site can undesirably increase the likelihood of cracks or breaks forming the substrate. In contrast, formation of protrusions that are coated and then at least partially removed, as described herein, does not reduce the minimum substrate thickness and, therefore, is less likely to increase formation of cracks, breaks or further weakening of the substrate. Furthermore, the present methods allow avoidance of complex and tedious masking/photoresist steps and therefore, provide increased efficiency and ease of use.

Figure 1A:
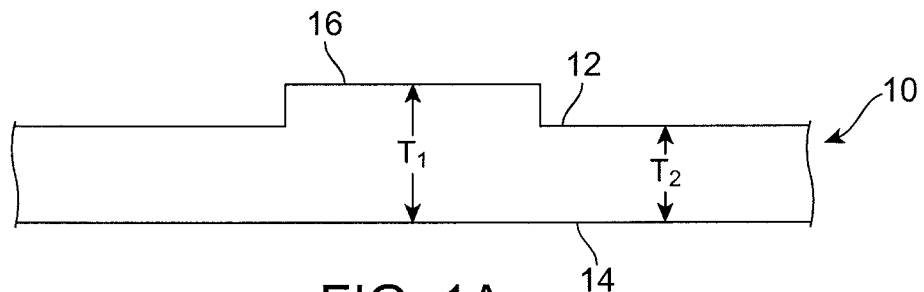
FIGS. 1A through 1D illustrate substrate fabrication according to an embodiment of the present invention.

Referring to FIGS. 1A through 1D, fabrication of a patterned piezoelectric substrate according to an embodiment of the present invention is illustrated. A substrate 10 is provided upon which electrically conductive material can be deposited and patterned (FIG. 1A). The substrate 10 will include a piezoelectric material and is not limited to any particular material composition. Various materials with piezoelectric properties can be utilized and can include, for example various ceramics, crystals, polymers, and the like. In one embodiment, piezoelectric substrate can include a tube-shaped substrate including piezoelectric material. Substrate can include ceramic substrate, such as a barium titanate piezoelectric ceramic material or a lead zirconate-lead titanate piezoelectric ceramic material. Exemplary piezoelectric tubes suitable for use according to the present invention can include proprietary or commercially available piezo tubes (e.g., such as those available from Physik Insrumente (PI) or PI Ceramic GmbH). Piezoelectric substrate material can make up the entire substrate 10 for patterning or can be less than the substrate entirety, including forming one or more components, layers, etc. of the substrate. As illustrated, the substrate 10 includes opposing first and second sides 12, 14, with side 12 including at least one protrusion 16. The protrusion 16 can include, as illustrated, a portion of the substrate where the cross-sectional thickness of the substrate at the protrusion is greater than the substrate thickness at locations adjacent to the protrusions (e.g., as illustrated by thickness $T_1$ compared to thickness $T_2$). The protrusion 16 can include a portion integral to other portions or the rest of the substrate, for example, so as to form a monolithic substrate material, and can be formed during substrate fabrication according to various methods including, e.g., molding, extrusion, machining, etc. Alternatively, the protrusion can include a component separate from other portions of the substrate, and may be separately added, deposited, attached, etc. to the substrate following fabrication of other substrate portions.

Figure 1B:
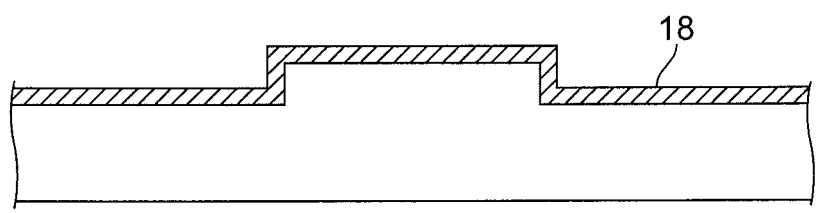

Next, one or more layers of a material 18 are deposited on the substrate so as to at least partially cover the substrate first side 12 and protrusion 16 (see, e.g., FIG. 1B). The material 18 will typically include a layer of an electrically conductive material or coating. Electrically conductive coatings are not limited to any particular materials and may include, for example, materials such as metallic electrodes or platings (e.g., nickel, gold, silver, etc., or combinations thereof). Electrically conductive coatings can include one or more coatings of electrically conductive coatings, and may include several layers of material or metal, such as a first layer of nickel and a second layer of gold. Additional coatings or layers may optionally be deposited, for example, on the substrate prior to deposition of an electrically conductive material, or may be deposited on the conductive material following deposition.

Figure 1C:
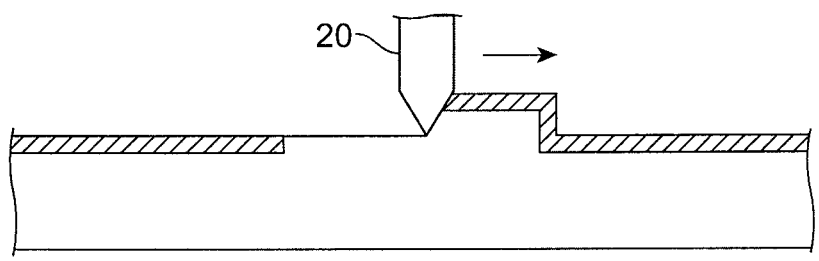
Figure 1D:
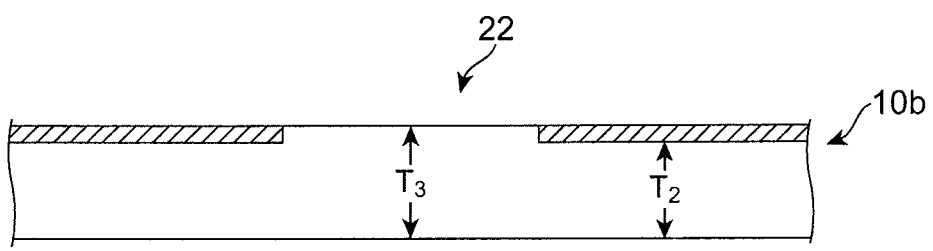

Following deposition of material 18, a portion of the deposited material coating can be removed while leaving some portions of the deposited coating substantially intact, thereby providing material coating selectively deposited or patterned on a substrate surface, as illustrated in FIGS. 1C and 1D. FIG. 1C illustrates a removal unit 20 removing a portion of the coated protrusion. Thus, removal of the deposited material 18 can include removal of both a portion of the protrusion 16 coated with the material coating the protrusion 16. Material removal can include various methodology including, for example, laser application, cutting, machining, and the like. FIG. 1D illustrates the patterned substrate 10b, or substrate 10 following removal of a portion of protrusion 18 as described, with deposited coating 18 still present at areas of the substrate (e.g., areas adjacent to the removal site) not subject to material removal processes as described. Material removal in such a fashion provides numerous advantages, as discussed above, including increased efficiency compared to commonly used methods involving masking and/or selective deposition. Additionally, material can be removed while avoiding thinning or weakening of the substrate. As illustrated in FIG. 1D, substrate 10b thickness at the site 22 of material removal will typically include a thickness equal to or greater than substrate thickness at other areas of the substrate, including areas adjacent to the removal site 22 (see, e.g., thickness $T_3$ compared to thickness $T_2$).

As described above, piezoelectric substrates of the present invention can be in the form of components configured for use in various applications and devices. In one embodiment, a patterned piezoelectric substrate can include a patterned piezoelectric tube. Such tubes can form components of piezoelectric assemblies or actuators in a variety of systems and devices. In one embodiment, such a device or system includes an imaging device, such as a scanning beam system/device. Exemplary scanning beam systems suitable for use in the present invention will include a scanning beam device or probe including an actuation assembly and a scanning optical fiber, as well as a base station for controlling the scanning beam device. The scanning beam devices or probes will often include a scanner for spatially scanning a beam of light over a target area of a target surface. As noted, the scanner can include a single, cantilevered optical fiber. Movement of the scanning fiber can be driven by an actuation assembly which can include a patterned piezoelectric tube of the present invention. While these scanning beam systems and scanning fiber systems generally encompass systems used for image acquisition, alternative embodiments may be used at least in part (or even primarily) for image display. Scanning beam and scanning fiber display systems may, for example, selectively project illuminating light from the end of the scanning fiber so as to generate an image on the target surface.

Figure 2:
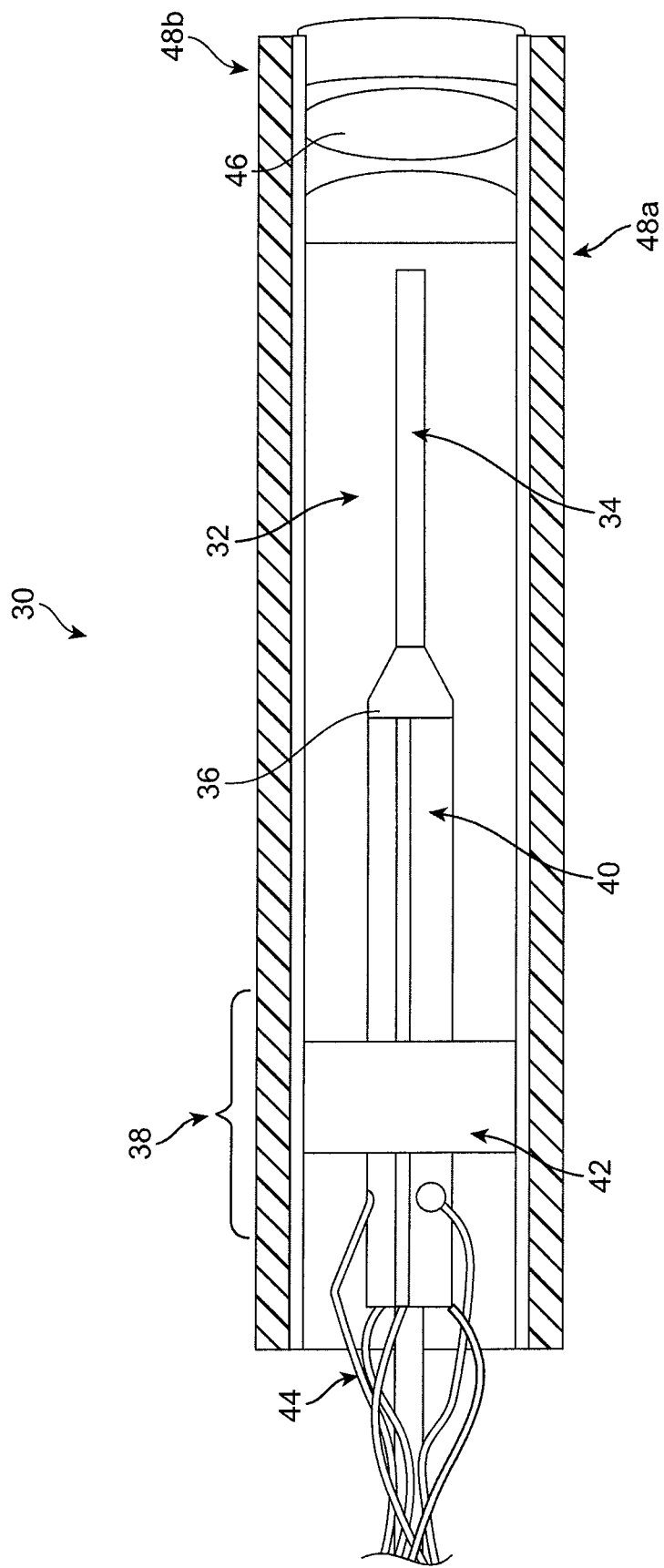
FIG. 2 is a diagram illustrating a distal portion of a scanning fiber device including a piezoelectric tube, according to an embodiment of the present invention.

A distal portion of an exemplary scanning fiber endoscope system including a patterned piezoelectric tube of the present invention is described with reference to FIG. 2. Scanning fiber endoscope embodiment 30 includes a housing 32, such as a cylindrical supporting housing, in which is disposed a scanning fiber 34 coupled by an attachment point 36 to an actuator assembly 38 that drives the fiber 34 to vibrate in resonant scanning mode. The actuator assembly 38 includes a patterned piezoelectric tube 40 which can be fabricated according to the methods described herein. The piezoelectric tube 40 is coupled to a housing attachment collar 42 that may be secured to the housing 32. Electronics 44 (e.g., tube drive wires) are coupled to the tube 40 so as to provide an applied voltage to the tube for piezoelectric based actuation and movement of the fiber 34 as described. Light emitted from the fiber 34 passes through the optical assembly 46 disposed substantially at the distal end of the housing and scans laterally and toward a target surface. The device further includes detectors 48a, 48b, which can include return fibers disposed around the housing, to detect backscattered light from the target surface.

A more complete description of suitable scanning beam systems and devices may be found in the following commonly owned U.S. patents and patent applications: U.S. Pat. No. 6,975,898; U.S. Pat. No. 6,845,190; U.S. patent application Ser. No. 10/956,241, entitled "Remapping Methods to Reduce Distortions in Images," filed Oct. 1, 2004, U.S. Pat. No. 7,298,473, entitled "Configuration Memory for a Scanning Beam Device," filed Oct. 1, 2004, U.S. Pat. No. 7,159,782, entitled "Methods of Driving a Scanning Beam Device to Achieve High Frame Rates," filed on Dec. 23, 2004, and U.S. Pat. No. 7,189,961, entitled "Scanning Beam Device with Detector Assembly," filed on Feb. 23, 2005, the complete disclosures of which are incorporated herein by reference.

Figure 3:
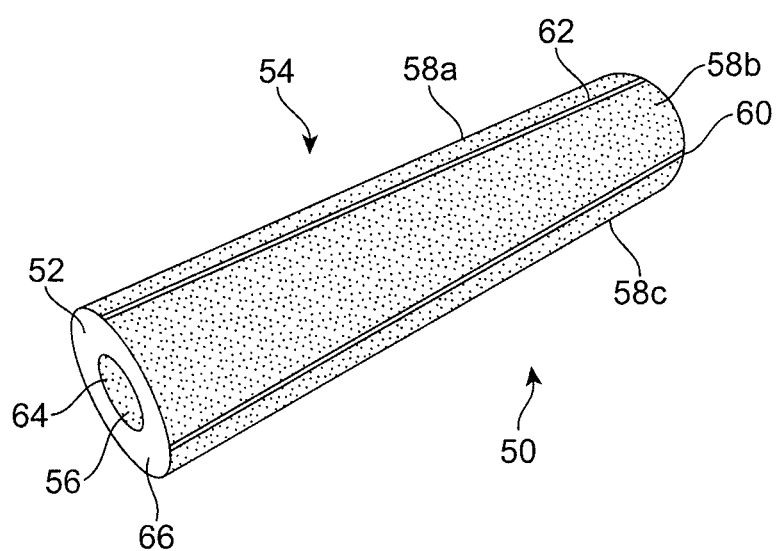
FIG. 3 shows a piezoelectric tube patterned with conducting regions and non-conducting separating regions, according to another embodiment of the present invention.
Figure 4:
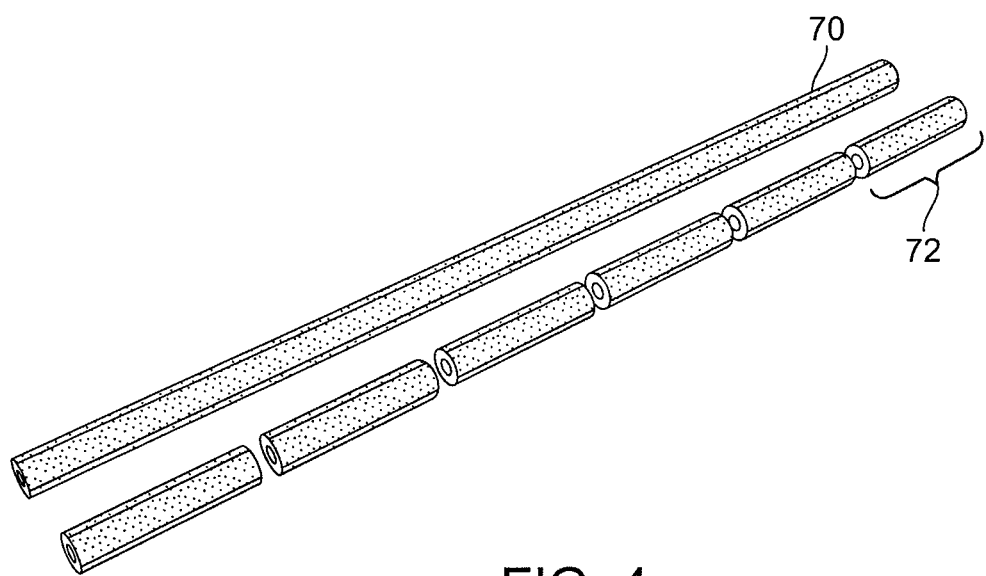
FIG. 4 illustrates piezoelectric tubes and sections thereof of differing lengths, according to another embodiment of the present invention.

As described above, a patterned substrate can include a patterned piezoelectric tube as illustrated, for example, in the embodiment shown in FIG. 3. The patterned tube embodiment 50 includes a tube comprising a piezoelectric material 52 (e.g., ceramic, polymer, etc.), which can be formed according to various molding, extrusion, machining techniques, and the like. The tube comprises an outer surface 54 and an inner lumen 56. The outer surface includes deposited electrically conductive material forming one or more electrodes 58a, 58b, 58c extending longitudinally along a length of the tube 50. Areas of deposited material or electrodes 58a, 58b, 58c are separated by non-conducting separating regions 60, 62. The inner lumen 56 includes electrically conductive material deposited therein so as to form one or more inner or central electrode 64. In the illustrated embodiment, the entire inner lumen 56 is coated to form central electrode 64. Tube 50 further includes an end face 66 that is non-metallized or non-conducting. Fabrication of tube embodiment 50 can be accomplished according to any of the methods described herein. Longer substrate tubes 70 can be provided having protrusions, followed by coating and removal as described, and then cut into short sections or lengths 72 where desired (see, e.g., FIG. 4).

Figure 5:
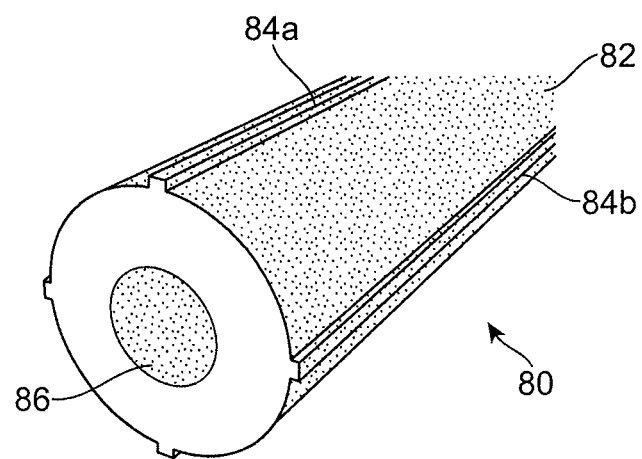
FIG. 5 illustrates a piezoelectric tube having protrusions and coated surfaces, according to an embodiment of the present invention.

Referring to FIG. 5, a piezoelectric tube having protrusions on an outer surface is described in more detail. The tube 80, similar to the described above, includes a substrate comprising a piezoelectric material. Tube 80 includes an outer surface 82 having various protrusions 84a, 84b extending longitudinally along a length of the tube 80. The outer surface 82, including the protrusions 84a, 84b, are metallized or coated with an electrically conductive material. Protrusions 84a, 84b can be partially or entirely removed to form non-conducting separating regions similar as described above and further illustrated in FIG. 3. Tube 80 includes an inner lumen 86 having a coating as described above.

Various piezoelectric tube sizing and dimensions can be selected according to the present invention and can depend, in part, on the desired use of the tube. As will be recognized, e.g., with reference to the figures and description herein, a tube will include an inner diameter (e.g., inner lumen diameter) and an outer diameter, as well as an inner lumen. Inner diameter sizing will typically be about 50 µm to about 500 µm (e.g., about 200 µm). Inner diameter can be selected at least partially based on size of an optical fiber to be disposed therein. In one embodiment, an optical fiber can include a diameter of about 80 µm, though various optical fiber sizes will be available. Outer tube diameter will typically be about 100 µm to about 1 mm (e.g., about 400 µm). Tube length will typically include lengths of about 1 mm to about 10 mm. As illustrated above, tubes can be cut from longer tubes.

Figure 6B:
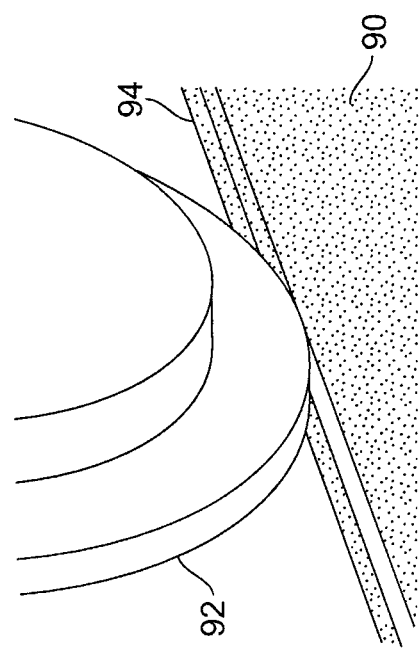
FIGS. 6A and 6B illustrate removal of a protrusion from a piezoelectric tube, according to an embodiment of the present invention.
Figure 6A:
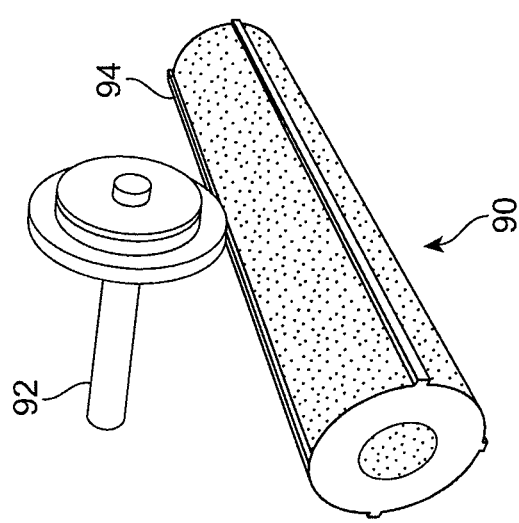

FIGS. 6A and 6B illustrate removal of a protrusion or portion thereof, from an outer surface of a tube 90 according to an embodiment of the present invention. A removal tool 92, which can include an abrasive disk or wheel, or any number of various cutting means, can be run along a length of the tube 90 to at least partially remove the coated protrusion 94. Material removal as described is accomplished so as to form a separating region between deposited material adjacent to the removal site. Removal of material as described herein can advantageously maintain the structural strength and integrity of the tube, compared to methods including coating deposition and removal in the absence of protrusions where removal of coating material cuts into the thickness of the tube itself and formation of a groove in the tube. Such a groove in the substrate material such as a piezoelectric tube will typically form a weakened area in the tube due to a decreased thickness in the tube at that area, thereby increasing the likelihood of cracks or breaks forming, and ultimately failure of the tube. In contrast, formation of protrusions that are coated and then at least partially removed, as described herein, does not reduce the minimum thickness of the tube at the removal site and is, therefore, less likely to increase formation of cracks, breaks or further weakening of the tube. Even where a protrusion is entirely removed such that the substrate material at the removal site is flush with substrate surface adjacent to the removal site, the thickness (e.g., minimum thickness) of the tube is maintained and further weakening of the tube can be avoided. The methods of the present invention are particularly advantageous with smaller tube sizes (e.g., microtubes), including tubes having the above described dimensions, for example, since reducing minimum thickness (such as by cutting grooves) in small sized tubes already having a relatively small thickness can be particularly problematic for maintaining tube strength and/or integrity. Formation of protrusions followed by protrusion removal, as described herein, allows more control in tube material removal and reduction in unwanted compromise in tube/structure integrity.

Figure 7B:
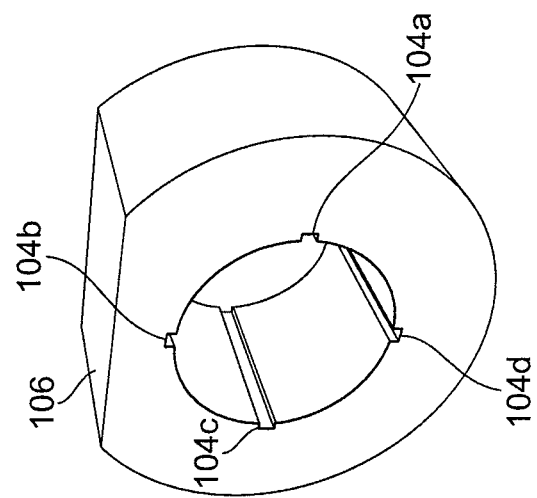
FIGS. 7A and 7B illustrate a patterned piezoelectric tube having protrusions disposed on the surface and coupled with an interlocking part.
Figure 7A:
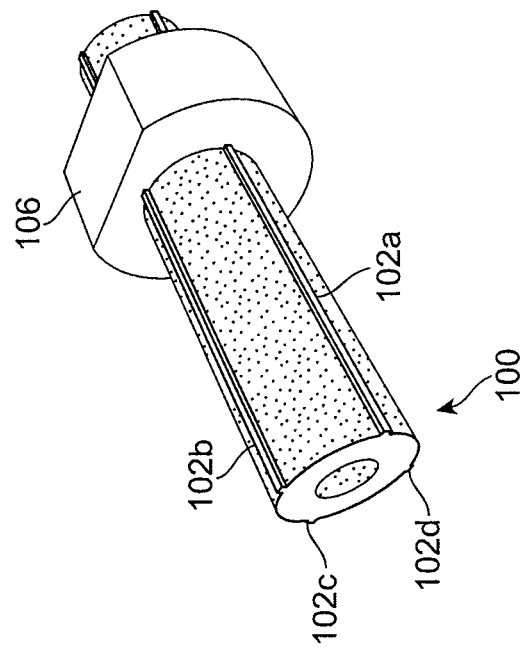

As noted above, protrusions can be removed entirely or only partially so as to remove coating covering the protrusions in substrate material and form separation regions between coated areas of the tube surface. In some cases, it may be desirable to only partially remove a protrusion during the removal process so as to leave an portion of uncoated protrusion on the surface of the tube. Partial removal of protrusions can provide numerous advantages, including formation of protruding non-conducting, separation regions designed to fit or mate with other components of a system, or actuation assembly. FIGS. 7A and 7B illustrate a piezoelectric tube having partially removed protrusions, where the tube is mated with a receiving part. Tube 100 includes protrusions 102*a*, 102*b*, 102*c*, 102*d*, each having a non-conducting surface. Protrusions are formed as described herein, where protrusions are coated and then a coated portion of the protrusion removed (see, e.g., above). Remaining portions of the protrusions are designed to fit within corresponding grooves 104*a*, 104*b*, 104*c*, 104*d* of mated part 106. Various tube and part designs can be included, and can include components in numerous piezoelectric based systems and assemblies.

Although the invention has been described with reference to the above examples, it will be understood that modifications and variations are encompassed within the spirit and scope of the invention. Accordingly, the invention is limited only by the following claims along with their full scope of equivalents.

What is claimed is:

1. A method of producing electrodes on a piezoelectric actuator tube, the method comprising:
   providing the piezoelectric actuator tube, the piezoelectric actuator tube comprising a piezoelectric material, an interior lumen and a curved outer surface comprising one or more radially extending piezoelectric protrusions, each of said one or more radially extending piezoelectric protrusions having a thickness extending from the curved outer surface;
   depositing a curved electrically conductive coating on the curved outer surface and the one or more radially extending piezoelectric protrusions so as to cover at least a portion of the curved outer surface and the one or more radially extending piezoelectric protrusions; and
   removing a portion of the one or more radially extending piezoelectric protrusions along with the curved electrically conductive coating in order to define patterned curved electrodes on the curved outer surface, wherein the curved electrically conductive coating on the curved outer surface remains entirely intact away from the one or more radially extending piezoelectric protrusions, thereby leaving the curved electrically conductive coating selectively patterned on the curved outer surface, wherein the thickness of said each of the one or more radially extending piezoelectric protrusions is substantially reduced.

2. The method of claim 1, wherein the piezoelectric material comprises a ceramic material.

3. The method of claim 1, wherein the piezoelectric actuator tube comprises a minimum thickness between the curved outer surface and a surface of the interior lumen that is maintained following the removing of the portion of the one or more radially extending piezoelectric protrusions.

4. The method of claim 3, wherein the minimum thickness is within a range from about 50 µm to about 500 µm.

5. The method of claim 1, wherein the entire thickness of the one or more radially extending piezoelectric protrusions is removed in the removing of the portion of the one or more radially extending piezoelectric protrusions.

6. The method of claim 1, wherein less than the entire thickness of the one or more radially extending piezoelectric protrusions is removed during the removing of the portion of the one or more radially extending piezoelectric protrusions.

7. The method of claim 6, wherein the one or more radially extending piezoelectric protrusions of the piezoelectric actuator tube are configured so as to be received by corresponding grooves of a mated part.

8. The method of claim 1, further comprising cutting the piezoelectric actuator tube along a longitudinal axis so as to produce a plurality of patterned tube sections.

9. The method of claim 1, wherein the piezoelectric actuator tube comprises a length within a range from about 1 mm to about 10 mm.

10. The method of claim 1, wherein the piezoelectric actuator tube comprises an outer diameter of about 100 µm to about 1 mm.

11. The method of claim 1, further comprising incorporating the piezoelectric actuator tube into a piezoelectric actuator assembly.

12. The method of claim 11, wherein the piezoelectric actuator assembly comprises a portion of a scanning beam device.

13. A scanning beam device comprising a piezoelectric actuator assembly comprising the piezoelectric actuator tube of claim 1.

14. The method of claim 1, wherein the piezoelectric material comprises a monolithic piezoelectric material forming the one or more radially extending piezoelectric protrusions.

15. The method of claim 1, wherein the removing of the portion of the one or more radially extending piezoelectric protrusions comprises mechanically machining or mechanically removing curved electrically conductive coating and piezoelectric material of the one or more radially extending piezoelectric protrusions.

16. A piezoelectric actuator tube fabricated according to the method of claim 1.

17. A method of producing electrodes on a piezoelectric actuator tube, comprising:
   providing the piezoelectric actuator tube, the piezoelectric actuator tube comprising a piezoelectric material, an interior lumen and a curved outer surface comprising one or more radially extending piezoelectric protrusions formed as a continuous portion of the tube piezoelectric material, each of said one or more radially extending piezoelectric protrusions having a thickness extending from the curved outer surface;

depositing a curved electrically conductive coating on the curved outer surface and the one or more radially extending piezoelectric protrusions so as to cover at least a portion of the curved outer surface and the one or more radially extending piezoelectric protrusions;

mechanically machining at least a portion of the one or more radially extending piezoelectric protrusions along with the curved electrically conductive coating so as to remove both the curved electrically conductive coating on the one or more radially extending piezoelectric protrusions and the piezoelectric material of the one or more radially extending piezoelectric protrusions, and leave the curved electrically conductive coating selectively patterned on the curved outer surface of the tube in order to define patterned curved electrodes on the curved outer surface, wherein the thickness of the one or more radially extending piezoelectric protrusions is substantially reduced by the machining.

18. A patterned piezoelectric actuator tube fabricated by a method comprising the method of claim 17.

19. A method of producing electrodes on a piezoelectric actuator tube, comprising:

providing the piezoelectric actuator tube, the piezoelectric actuator tube comprising a piezoelectric material, an interior lumen and a curved outer surface comprising one or more radially extending piezoelectric protrusions formed as a continuous portion of the tube piezoelectric material, each of the one or more radially extending piezoelectric protrusions having a thickness extending from the curved outer surface;

depositing a curved electrically conductive coating on the curved outer surface and the one or more radially extending piezoelectric protrusions so as to cover at least a portion of the curved outer surface and the one or more radially extending piezoelectric protrusions; and removing at least a portion of the one or more radially extending piezoelectric coated protrusions along with the curved electrically conductive coating and the piezoelectric material of the one or more radially extending piezoelectric protrusions, and leave the curved electrically conductive coating on the curved outer surface entirely intact away from the one or more radially extending piezoelectric protrusions, thereby leaving the curved electrically conductive coating selectively patterned on the curved outer surface in order to define patterned curved electrodes on the curved outer surface, wherein the thickness of the one or more radially extending piezoelectric protrusions is substantially reduced by the removing.

20. The method of claim 19, wherein the removing comprises mechanically machining or mechanically removing at least a portion of the one or more radially extending piezoelectric protrusions so as to remove both the curved electrically conductive coating on the one or more radially extending piezoelectric protrusions and the piezoelectric material of the one or more radially extending piezoelectric protrusions.

21. A patterned piezoelectric actuator tube fabricated according to the method of claim 19.

* * * * *